US006686794B1

United States Patent
Abidin et al.

(10) Patent No.: US 6,686,794 B1
(45) Date of Patent: Feb. 3, 2004

(54) DIFFERENTIAL CHARGE PUMP

(75) Inventors: Cindra W. Abidin, West Los Angeles, CA (US); Georgios Asmanis, North Hollywood, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/323,469

(22) Filed: Dec. 19, 2002

(51) Int. Cl.[7] .................................................. H03L 7/06
(52) U.S. Cl. ........................................ 327/537; 327/536
(58) Field of Search ................................ 327/157, 156, 327/537, 536, 437

(56) References Cited

U.S. PATENT DOCUMENTS

| | | | | | |
|---|---|---|---|---|---|
| 5,598,209 | A | * | 1/1997 | Cortjens et al. | 348/211 |
| 5,936,445 | A | * | 8/1999 | Babanezhad et al. | 327/157 |
| 6,275,097 | B1 | * | 8/2001 | Liang et al. | 327/157 |
| 6,385,265 | B1 | * | 5/2002 | Duffy et al. | 327/148 |

OTHER PUBLICATIONS

Juárez-Hernández, Esdra et al., "A Novel CMOS Charge-Pump Circuit with Positive Feedback for PLL Applications", Instituto Techológico de Chihuahua, Electro 2001. p. 283–286.*

St. Pierre, Robert, "Low-Power BiCMOS Op-Amp with Integrated Current-Mode Charge Pump", IEEE Journal of Solid-State Circuits, vol. 35, No. 7, Jul. 2000, 0018–9200. p. 1046–2050.*

Lin, Li et al., "TP 12.5: A 1.4GHz Differential Low-Noise CMOS Frequency Synthesizer using a Wideband PLL Architecture" 3pgs.*

"Properties of the Charge-Pump Voltage Splitter", Dec. 7 2000, ©2002 Maxim Integrated Products, download from http://www.maxim-ic.com/appnotes.cfm/appnote_number/718 on Oct. 30, 2002. 5 pgs.*

* cited by examiner

Primary Examiner—Dinh T. Le
(74) Attorney, Agent, or Firm—Buckley, Maschoff & Talwalkar LLC (57) ABSTRACT

According to some embodiments, a charge pump includes a first current source coupled to a first and a second switch, each of the first and the second switch to receive a respective component of a first differential control signal, a second current source coupled to a third and a fourth switch, each of the third and the fourth switch to receive a respective component of a second differential control signal, the first switch and the third switch coupled to a first node to provide a first component of a differential output signal, and the second switch and the fourth switch coupled to a second node to provide a second component of the differential output signal, a third current source to source current to the first node, and a fourth current source to source current to the second node.

14 Claims, 7 Drawing Sheets

DIFFERENTIAL CHARGE PUMP

BACKGROUND

Charge pump circuits are used to source current to or sink current from a load in response to control signals. Typically, these control signals consist of an UP signal and a DOWN signal. Current is sourced to the load in a case that the UP signal is active and the DOWN signal is inactive, and current is sunk from the load in a case that the UP signal is inactive and the DOWN signal is active. Ideally, no current flows through the load if both control signals are in the same state.

In a non-ideal charge pump, some current flows to or from the load if both control signals are in the same state. This current is known as leakage current. A charge pump is often designed in view of a maximum allowable leakage current specified by applicable charge pump design specifications.

Leakage current affects the output swing of a charge pump. More particularly, output swing is defined as the maximum swing at the output of a charge pump which results in a leakage current that is less than the specified maximum allowable leakage current. Some applications require charge pumps having one or more of a high output swing, a high output impedance, a stable common-mode output, and low voltage headroom requirements.

DETAILED DESCRIPTION

In the following description, particular types of circuits and circuit elements are described for purposes of illustration. Other embodiments, however, are applicable to other types of circuits. Further, although complementary metal-oxide semiconductor (CMOS) gates are referred to in the illustrations that follow, it will be appreciated by those of ordinary skill in the art that some embodiments may be implemented using various other types of process technologies, including bipolar junction transistor technologies.

Figure 1:
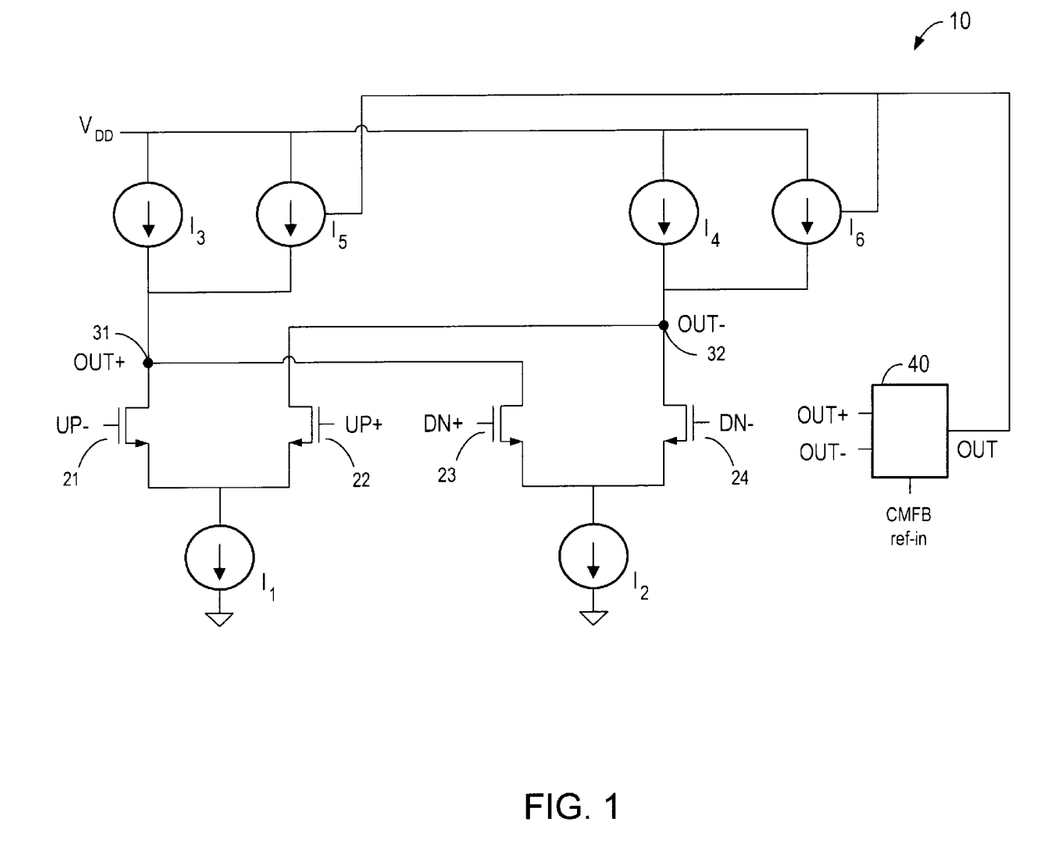
FIG. 1 is a diagram illustrating a charge pump according to some embodiments.

FIG. 1 is a diagram of charge pump 10 according to some embodiments. As shown, the UP and DOWN signals used to control charge pump 10 are differential signals, each composed of two components which together define a state of the respective differential signals. The output signal generated by charge pump 10 is also a differential signal. Accordingly, charge pump 10 is fully differential.

Charge pump 10 includes current sources $I_1$ and $I_2$. Each of current sources $I_1$ and $I_2$ may be implemented as a cascode current source so as to increase an output impedance of charge pump 10. A specific implementation of current sources $I_1$ and $I_2$ will be described below with respect to FIG. 4. Current source $I_1$ is coupled to switch 21 and to switch 22, each of which is implemented by an n-channel metal-oxide semiconductor (NMOS) transistor. A gate of switch 21 receives the UP− component of the differential UP control signal, and a gate of switch 22 receives the UP+ component of the UP control signal. Current source $I_2$ is similarly coupled to switches 23 and 24, each of which is also implemented by an NMOS transistor. As such, a gate of switch 23 receives the DOWN+ component of the differential DOWN control signal, and a gate of switch 24 receives the DOWN− component of the DOWN control signal. By design, the values of current sources $I_1$ and $I_2$ are equal.

A drain of switch 21 and a drain of switch 23 are both coupled to node 31. Node 31 provides the OUT+ component of the differential output signal generated by charge pump 10. Node 32 provides the complementary OUT− component of the output signal, and is coupled to a drain of switch 22 and a drain of switch 24. Node 32 is also coupled to current sources 14 and 16, while node 31 is coupled to current sources 13 and 15. As will be described in conjunction with FIGS. 2 and 3, current sources 14 and 16 may be considered a single current source, as may current sources 13 and 15.

Current sources 15 and 16 are each coupled to an output of common-mode feedback amplifier 40. In some embodiments, common-mode feedback amplifier 40 is intended to provide a signal to current sources $I_5$ and $I_6$ that results in $I_3+I_5=I_1$ and in $I_4+I_6=I_2$. Amplifier 40 determines this signal by receiving the differential output signal of charge pump 10. Accordingly, amplifier 40 is coupled to nodes 31 and 32. This coupling is not depicted in FIG. 1 for the sake of clarity.

More particularly, amplifier 40 receives the differential output signal, detects a common-mode output voltage of charge pump 10 based on the differential output signal, receives a common-mode reference voltage (CMFB ref-in), and determines its output signal based on the detected voltage and the reference voltage. In some embodiments, the signal output by amplifier 40 not only results in $I_3+I_5=I_1$ and in $I_4+I_6=I_2$, but also results in a common-mode output voltage that is equal to CMFB ref-in.

In one example of operation, it will be assumed that the UP control signal is active (UP+=high, UP−=low) and the DOWN control signal is inactive (DOWN+=low, DOWN−=high). As a result of these signal component values, current sources $I_3$ and $I_5$ are coupled to node 31. The total current at node 31 therefore equals the sum of current sources $I_3$ and $I_5$. These signal component values also couple current sources $I_4$, $I_6$, $I_1$ and $I_2$ to node 32, resulting in a total current at node 32 that is equal to $I_4+I_6-I_1-I_2$. As mentioned above, the output signal of common-mode feedback amplifier 40 results in $I_3+I_5=I_1$ and in $I_4+I_6=I_2$. The total current at node 31 therefore equals $I_1$ and the total current at node 32 equals $-I_1$. Accordingly, the above-described values of the differential control signals cause charge pump 10 to charge a load coupled to nodes 31 and 32 with a total differential output signal of out+−out−=$I_1-(-I_1)=2I_1$.

In a case that the UP control signal is inactive (UP+=low, UP−=high) and the DOWN control signal is active (DOWN+=high, DOWN−=low), current sources $I_4$ and $I_6$ are coupled to node 32 and current sources $I_3$, $I_5$, $I_1$ and $I_2$ are coupled to node 31. Applying the equalities listed above, the total current at node 31 equals $-I_2$ and the total current at node 32 equals $I_2$. These control signal values therefore cause charge pump 10 to charge a load coupled to nodes 31 and 32 with a total differential output signal of out+−out−=−$I_2$−($I_2$)=−$2I_2$. In other words, charge pump 10 discharges the load with a current equal to $2I_2$.

If both the UP control signal and the DOWN control signal are inactive, the total current at node 31 is equal to $I_3+I_5+I_1=0$. Similarly, the total current at node 32 is equal to $I_4+I_6+I_2=0$. Therefore, the total current at each node is equal and the load is not charged. If both the UP control signal and the DOWN control signal are active, the total current at node 31 is equal to $I_4+I_6-I_1=I_2-I_1=0$ and the total current at node 32 is equal to zero. Again, the total current at each node is equal to zero and the load is not charged.

Figure 2:
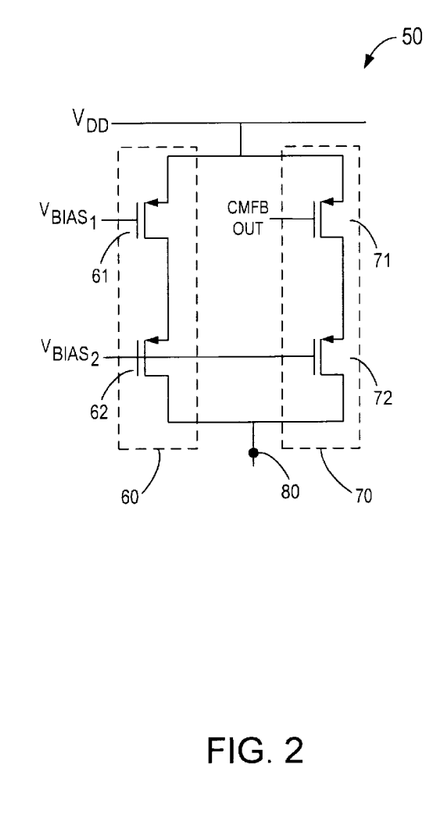
FIG. 2 is a diagram of a current source according to some embodiments.

FIG. 2 illustrates current source 50 according to some embodiments. Current source 50 comprises one implementation of current sources $I_3$ and $I_5$ and/or one implementation of current sources $I_4$ and $I_6$. For example, circuit portion 60 may represent one implementation of current source $I_3$ and circuit portion 70 may represent one implementation of current source $I_5$.

Current source 50 comprises p-channel metal-oxide semiconductor (PMOS) transistors 61, 62, 71 and 72. As shown, a source of transistor 61 is coupled to a supply voltage and a gate of transistor 61 is coupled to a first bias voltage. A source of transistor 62 is coupled to a drain of transistor 61 and a gate of transistor 62 is coupled to a second bias voltage. The first and the second bias voltage are defined so that transistors 61 and 62 are saturated.

A source of transistor 71 is coupled to the supply voltage and a gate of transistor 71 is coupled to a third bias voltage received from common-mode feedback amplifier 40. As mentioned above, the voltage received from amplifier 40 attempts to ensure that a current generated by current source 50 is equal to a current generated by each of current sources $I_1$ and $I_2$. A source of transistor 72 is coupled to a drain of transistor 71, a gate of transistor 72 is coupled to the second bias voltage to provide saturation of transistor 72, and a drain of transistor 72 is coupled to a drain of transistor 62. Node 80 of FIG. 2 corresponds to either node 31 or node 32 of FIG. 1.

The output impedance of charge pump 10 at node 31 at a given time is approximately equal to the output impedance of current source $I_3$ in parallel with the output impedance of current source $I_5$. Therefore, the output impedances of current sources $I_3$ and $I_5$ significantly affect the output impedance of charge pump 10. In a case that current source 50 implements current sources $I_3$ and $I_5$, the output impedance of current source $I_3$ approximately equals $gm_{62}ro_{62}ro_{61}$ and the output impedance of current source $I_5$ approximately equals $gm_{72}ro_{72}ro_{71}$.

Figure 3:
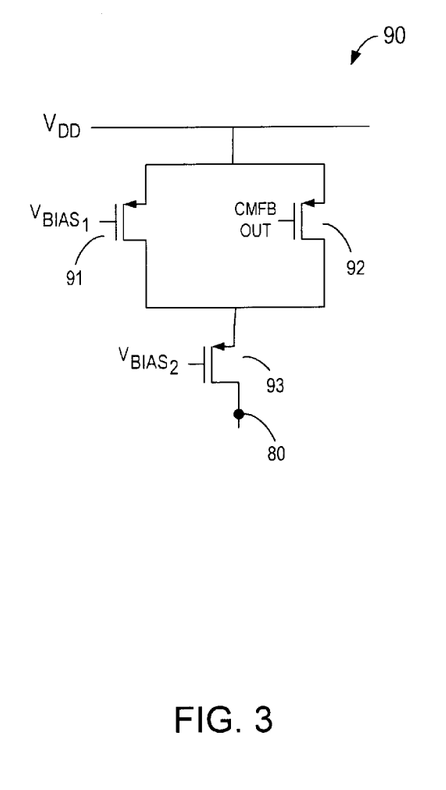
FIG. 3 is a diagram of a current source according to some embodiments.

FIG. 3 is a diagram of current source 90 according to some embodiments. Current source 90 also represents an implementation of current sources $I_3$ and $I_5$ and/or current sources $I_4$ and $I_6$. As shown, a source of PMOS transistor 91 is coupled to a supply voltage and a gate of transistor 91 is coupled to a first bias voltage to provide saturation. A source of PMOS transistor 92 is coupled to the supply voltage, a drain of transistor 92 is coupled to a drain of transistor 91, and a gate of transistor 92 is coupled to the above-described output voltage received from common-mode feedback amplifier 40. The drains of transistors 91 and 92 are also coupled to a source of transistor 93, and a gate of transistor 93 is coupled to a second bias voltage. Node 80 of FIG. 3 again corresponds to either node 31 or node 32 of FIG. 1.

Current source 90 provides another way of influencing the output impedance of charge pump 10. In this regard, in a case that current source 90 implements current sources $I_3$ and $I_5$, the output impedance at out+ is approximately equal to $(gm_{93}ro_{93})(ro_{91}//ro_{92})//$(output impedance of switch connected to out+).

Figure 4:
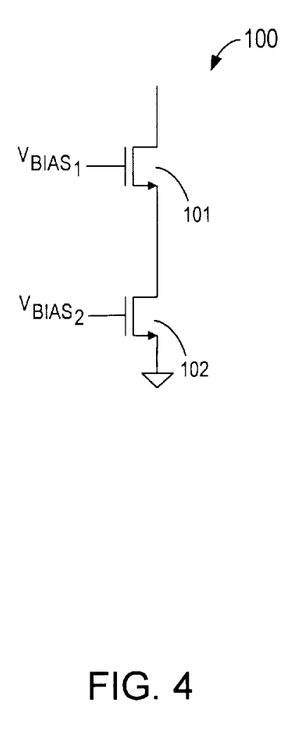
FIG. 4 is a diagram of a cascode current source according to some embodiments.

FIG. 4 illustrates current sources $I_1$ and/or $I_2$ according to some embodiments. Current source 100 is a cascode current source including NMOS transistors 101 and 102. A source of transistor 101 is coupled to a drain of transistor 102, and both transistors are biased to operate in saturation. Of course, other implementations of current sources $I_1$ and/or $I_2$ may be used in conjunction with some embodiments.

Figure 5:
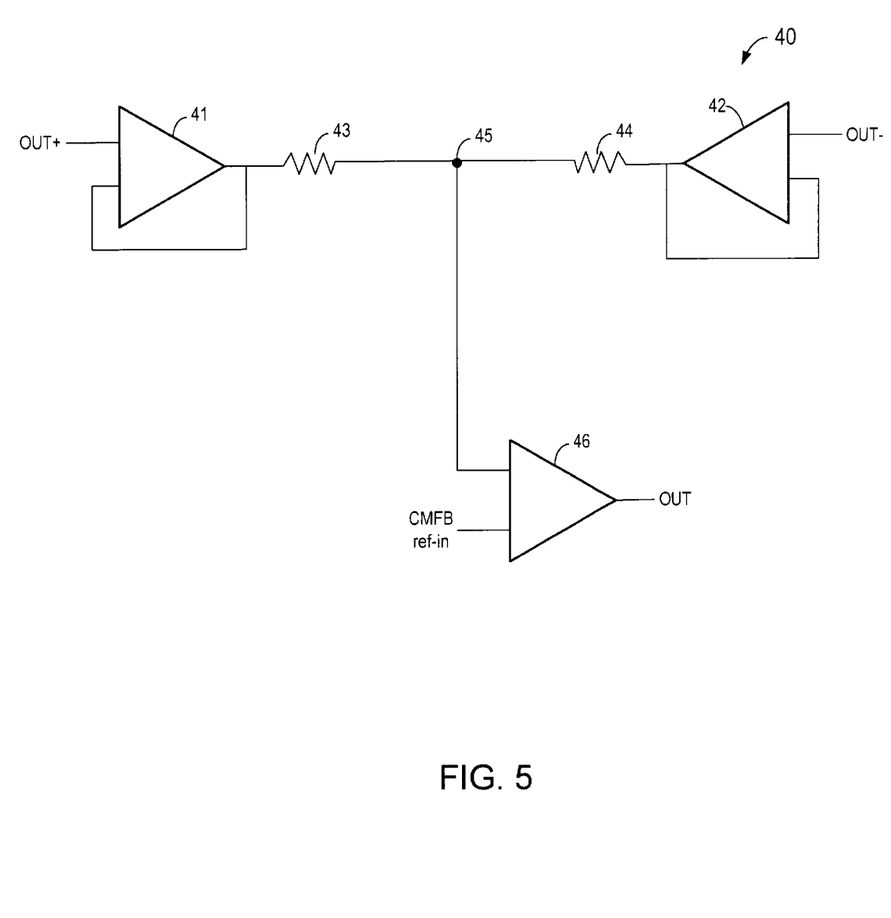
FIG. 5 is a diagram of a common-mode feedback amplifier according to some embodiments.

FIG. 5 is a diagram of an implementation of common-mode feedback amplifier 40. Common-mode feedback amplifier 40 outputs a signal to current sources $I_5$ and $I_6$ such that $I_3+I_5=I_1$ and $I_4+I_6=I_2$. Amplifier 40 also stabilizes the common-mode output of charge pump 10 using an input common-mode reference voltage.

Amplifier 40 includes amplifier 41, which receives the out+ component of the differential output signal of charge pump 10. As shown, one input of amplifier 41 is coupled to the output of amplifier 41. Amplifier 42 receives the out− component of the differential output signal. Again, one input of amplifier 42 is coupled to the output of amplifier 42. In operation, amplifier 41 functions as a unity gain buffer to sample a voltage signal at node 31. Amplifier 42 functions similarly to sample a voltage signal at node 32. A specific implementation of amplifier 41 and/or amplifier 42 is described below and illustrated in FIG. 6.

Resistor 43 is coupled to the output of amplifier 41 and to node 45. Resistor 44 is in turn coupled to node 45 and to the output of amplifier 42. Resistors 43 and 44 generate a common-mode voltage at node 45 that represents an average of the out+ and out− components, or the common-mode output of charge pump 10.

Comparator 46 outputs a signal based on a difference between a common-mode reference voltage and a common-mode voltage detected from the differential output signal. In this regard, a first input of comparator 45 is coupled to node 46 to receive the detected common-mode voltage. A second input of comparator 45 receives the common-mode reference voltage. Comparator 46 compares the two input voltages and generates an output signal equal to the gain of comparator 46 multiplied by a difference between the two voltages.

Figure 6:
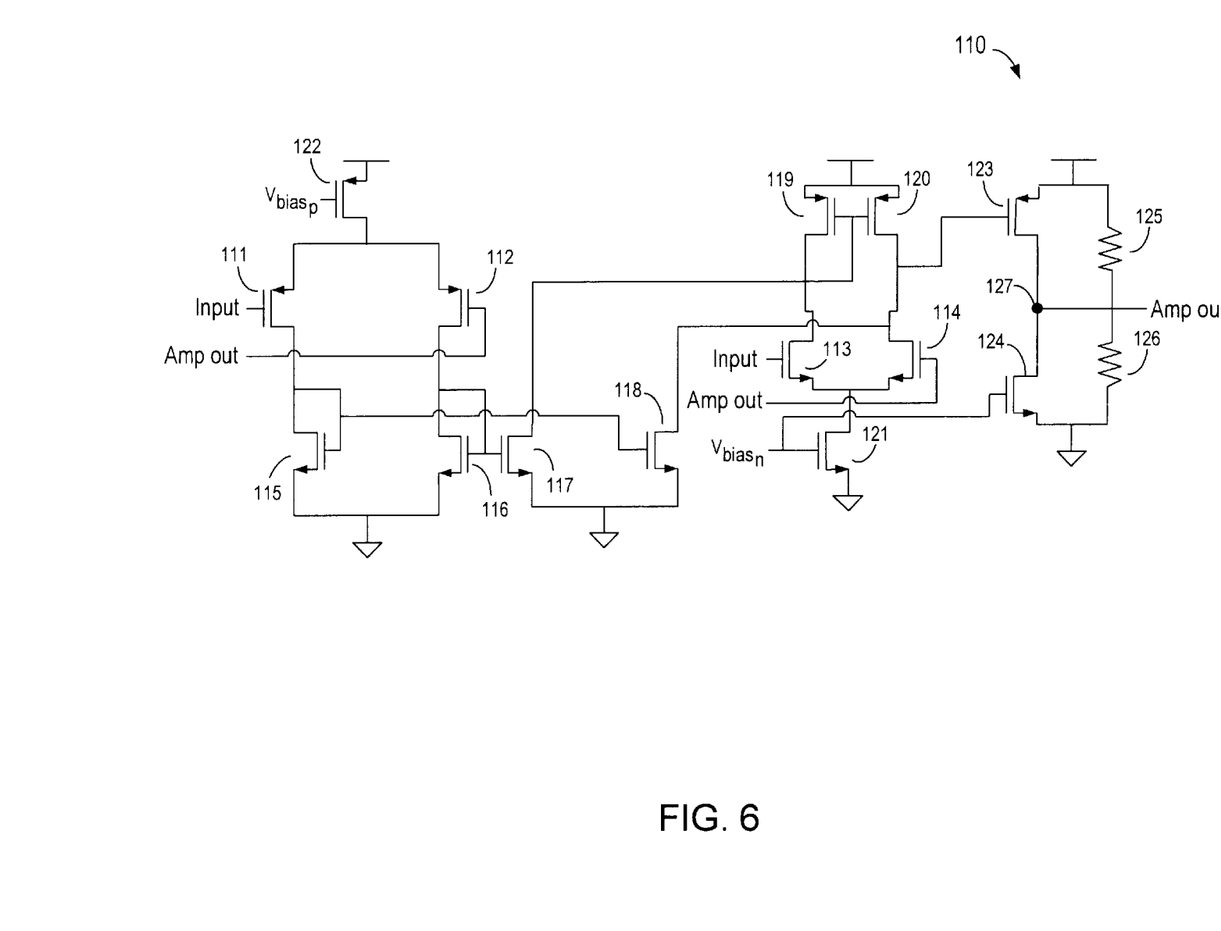
FIG. 6 is a diagram of a unity gain amplifier of the FIG. 5 common-mode feedback amplifier according to some embodiments.

Amplifier 110 of FIG. 6 represents an implementation of amplifier 41 and/or amplifier 42 according to some embodiments. Amplifier 110 may be used to support wide-swinging input values. The signal lines labeled Input in FIG. 6 are coupled to one another, as are the signal lines labeled Amp Out. These couplings are omitted from FIG. 6 for the sake of clarity.

The out+ component signal of charge pump 10 is received on the signal lines labeled Input in a case that amplifier 110 implements amplifier 41. In a case that amplifier 110 implements amplifier 42, the signal lines labeled Input receive the out− component signal of charge pump 10. In operation, PMOS transistors 111 and 112 will be active if the common-mode Input signal (out+ or out−) is low, and NMOS transistors 113 and 114 will be active if the common-mode Input signal is high. Each of transistors 111 through 114 will be active if the input signal is within the input swing range of amplifier 110.

More particularly, transistors 111 and 112 will generate a current that corresponds to a difference between the Input and Amp out signals in a case that the Input signal is low. NMOS transistors 115 and 116 will mirror this current to NMOS transistors 117 and 118, and the current continues through an output impedance to produce the Amp out voltage signal. The output impedance is given by $Z_{113} \| Z_{119}$ or $Z_{114} \| Z_{120}$.

Transistors 113, 114, 119 and 120 do not provide gain if the Input signal is low. In these cases, NMOS transistor 121 does not have sufficient headroom to operate as a current source.

If the Input signal is high, transistors 113 and 114 generate a current that corresponds to (Input—Amp out). This current flows to the output impedance described above to produce the Amp out voltage signal. The stage implemented by transistors 111, 112, 115, 116, 117,118 and 122 provides substantially no gain if the Input signal is high because transistor 122 lacks the headroom necessary to operate.

The output of amplifier 110 comprises a unity gain buffer. The buffer is implemented by PMOS transistors 123 and 124 and resistors 125 and 126 as shown in FIG. 6. In operation, the buffer buffers the output impedance at node 127.

Figure 7:
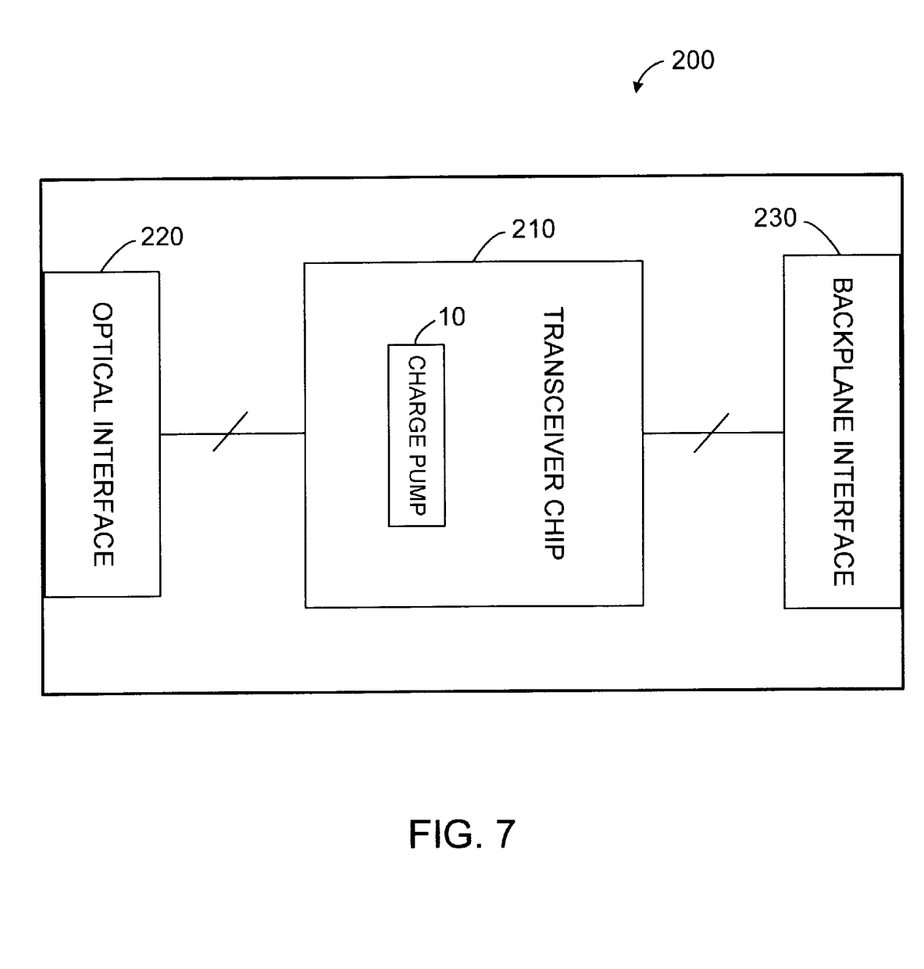
FIG. 7 is a block diagram of a system according to some embodiments.

FIG. 7 is a block diagram of a system according to some embodiments. System 200 includes transceiver chip 210 for receiving and transmitting data. Transceiver chip 210 includes charge pump 10 within a Clock Recovery Circuit (CRC). The CRC is used to extract a clock from a received data signal.

Such a signal may be received from optical interface 220. Optical interface 220 is coupled to transceiver 210, receives electrical signals from transceiver 210, and transmits optical signals based on the received electrical signals. Optical interface also receives optical signals and transmits electrical signals to transceiver 210 based on the received optical signals. Backplane interface 230 is also coupled to transceiver 210. Electrical signals are transmitted between transceiver 210 and a backplane (not shown) through backplane interface 230. System 200 may be embodied in a communications module. The communications module may in turn be an element of a line card used to transmit and receive data to and from an optical medium.

Charge pump 10 may also be embodied in a Phase-Lock Loop or other circuit requiring a high-speed, fully-differential, low-voltage, high-swing complementary metaloxide semiconductor charge pump. However, embodiments need not possess all or any of these characteristics.

The several embodiments described herein are solely for the purpose of illustration. Embodiments may include any currently or hereafter-known current sources, switches and amplifiers. Therefore, persons skilled in the art will recognize from this description that other embodiments may be practiced with various modifications and alterations.

What is claimed is:

1. A charge pump comprising:
   a first current source coupled to a first and a second switch, the first switch to receive a first component of a first differential control signal, and the second switch to receive a second component of the first differential control signal;
   a second current source coupled to a third and a fourth switch, the third switch to receive a first component of a second differential control signal, and the fourth switch to receive a second component of the second differential control signal, the first switch and the third switch coupled to a first node to provide a first component of a differential output signal, and the second switch and the fourth switch coupled to a second node to provide a second component of the differential output signal;
   a third current source coupled to the first node, the third current source to generate a third current and to source the third current to the first node, the third current source comprising:
      a first transistor, a source of the first transistor coupled to a supply voltage and a gate of the first transistor coupled to a first bias voltage;
      a second transistor, a source of the second transistor coupled to a drain of the first transistor and a gate of the second transistor coupled to a second bias voltage;
      a third transistor, a source of the third transistor coupled to the supply voltage and a gate of the first transistor coupled to a third bias voltage received from a common-mode feedback amplifier; and
      a fourth transistor, a source of the fourth transistor coupled to a drain of the third transistor, a gate of fourth transistor coupled to the second bias voltage, and a drain of the fourth transistor coupled to a drain of the second transistor; and
   a fourth current source coupled to the second node, the fourth current source to generate a fourth current and to source the fourth current to the second node.

2. A charge pump according to claim 1, further comprising:
   a common-mode feedback amplifier coupled to the first node and to the second node.

3. A charge pump according to claim 2, wherein the common-mode feedback amplifier is to receive a common-mode reference signal, to detect a common-mode voltage based on the differential output signal received from the first node and the second node, and to output a signal based on a difference between the common-mode reference signal and the detected common-mode voltage.

4. A charge pump according to claim 2, wherein the common-mode feedback amplifier is to provide a signal to the third current source and to the fourth current source, the signal to cause the third current generated by the third current source to equal a first current generated by the first current source and to cause the fourth current generated by the fourth current source to equal a second current generated by the second current source.

5. A charge pump according to claim 1, wherein the third current generated by the third current source is to equal a first current generated by the first current source and wherein the fourth current generated by the fourth current source is to equal a second current generated by the second current source.

6. A charge pump according to claim 1, wherein the first and second current sources comprise cascode current sources.

7. A charge pump according to claim 1, wherein the common-mode feedback amplifier is to generate the third bias voltage based on a difference between a common-mode reference signal and a common-mode voltage determined from the first and second components of the differential output signal received from the first node and the second node.

8. A charge pump comprising:
   a first current source coupled to a first and a second switch, the first switch to receive a first component of a first differential control signal, and the second switch to receive a second component of the first differential control signal;
   a second current source coupled to a third and a fourth switch, the third switch to receive a first component of a second differential control signal, and the fourth switch to receive a second component of the second differential control signal, the first switch and the third switch coupled to a first node to provide a first component of a differential output signal, and the second switch and the fourth switch coupled to a second node to provide a second component of the differential output signal;

a third current source coupled to the first node, the third current source to generate a third current and to source the third current to the first node, the third current source comprising:
  a first transistor, a source of the first transistor coupled to a supply voltage and a gate of the first transistor coupled to a first bias voltage;
  a second transistor, a source of the second transistor coupled to the supply voltage, a gate of the first transistor coupled to a second bias voltage received from a common-mode feedback amplifier, and a drain of the second transistor coupled to a drain of the first transistor; and
  a third transistor, a source of the third transistor coupled to the drain of the second transistor and to the drain of the first transistor and a gate of the third transistor coupled to a third bias voltage; and a fourth current source coupled to the second node, the fourth current source to generate a fourth current and to source the fourth current to the second node.

9. A charge pump according to claim 8, wherein the common-mode feedback amplifier is to generate the third bias voltage based on a difference between a common-mode reference signal and a common-mode voltage determined from the first and second components of the differential output signal received from the first node and the second node.

10. A system comprising:
  a transceiver comprising:
    a first current source coupled to a first and a second switch, the first switch to receive a first component of a first differential control signal, and the second switch to receive a second component of the first differential control signal;
    a second current source coupled to a third and a fourth switch, the third switch to receive a first component of a second differential control signal, and the fourth switch to receive a second component of the second differential control signal, the first switch and the third switch coupled to a first node to provide a first component of a differential output signal, and the second switch and the fourth switch coupled to a second node to provide a second component of the differential output signal;
    a third current source coupled to the first node, the third current source to generate a third current and to source the third current to the first node, the third current source comprising:
      a first transistor, a source of the first transistor coupled to a supply voltage and a gate of the first transistor coupled to a first bias voltage;
      a second transistor, a source of the second transistor coupled to a drain of the first transistor and a gate of the second transistor coupled to a second bias voltage;
      a third transistor, a source of the third transistor coupled to the supply voltage and a gate of the first transistor coupled to a third bias voltage received from a common-mode feedback amplifier; and
      a fourth transistor, a source of the fourth transistor coupled to a drain of the third transistor, a gate of fourth transistor coupled to the second bias voltage, and a drain of the fourth transistor coupled to a drain of the second transistor; and
    a fourth current source coupled to the second node, the fourth current source to generate a fourth current and to source the fourth current to the second node; and
  an optical interface coupled to the transceiver to receive and to transmit optical signals.

11. A system according to claim 10, further comprising:
  a backplane interface coupled to the transceiver to receive and transmit electrical signals to a backplane.

12. A system according to claim 10, wherein the common-mode feedback amplifier is to generate the third bias voltage based on a difference between a common-mode reference signal and a common-mode voltage determined from the first and second components of the differential output signal received from the first node and the second node.

13. A system comprising:
  a transceiver comprising:
    a first current source coupled to a first and a second switch, the first switch to receive a first component of a first differential control signal, and the second switch to receive a second component of the first differential control signal;
    a second current source coupled to a third and a fourth switch, the third switch to receive a first component of a second differential control signal, and the fourth switch to receive a second component of the second differential control signal, the first switch and the third switch coupled to a first node to provide a first component of a differential output signal, and the second switch and the fourth switch coupled to a second node to provide a second component of the differential output signal;
    a third current source coupled to the first node, the third current source to generate a third current and to source the third current to the first node, the third current source comprising:
      a first transistor, a source of the first transistor coupled to a supply voltage and a gate of the first transistor coupled to a first bias voltage;
      a second transistor, a source of the second transistor coupled to the supply voltage, a gate of the first transistor coupled to a second bias voltage received from a common-mode feedback amplifier, and a drain of the second transistor coupled to a drain of the first transistor; and
      a third transistor, a source of the third transistor coupled to the drain of the second transistor and to the drain of the first transistor and a gate of the third transistor coupled to a third bias voltage; and
    a fourth current source coupled to the second node, the fourth current source to generate a fourth current and to source the fourth current to the second node; and
    an optical interface coupled to the transceiver to receive and to transmit optical signals.

14. A system according to claim 13, wherein the common-mode feedback amplifier is to generate the third bias voltage based on a difference between a common-mode reference signal and a common-mode voltage determined from the first and second components of the differential output signal received from the first node and the second node.

* * * * *